(12) United States Patent
Hayakawa et al.

(10) Patent No.: US 12,174,245 B2
(45) Date of Patent: Dec. 24, 2024

(54) RECIPE INFORMATION PRESENTATION SYSTEM AND RECIPE ERROR INFERENCE SYSTEM

(71) Applicant: Hitachi High-Tech Corporation, Tokyo (JP)

(72) Inventors: Kouichi Hayakawa, Tokyo (JP); Masami Takano, Tokyo (JP); Kazuhiro Ueda, Tokyo (JP); Masayoshi Ishikawa, Tokyo (JP); Yasuhiro Yoshida, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 363 days.

(21) Appl. No.: 17/634,809

(22) PCT Filed: Sep. 6, 2019

(86) PCT No.: PCT/JP2019/035140
§ 371 (c)(1),
(2) Date: Feb. 11, 2022

(87) PCT Pub. No.: WO2021/044611
PCT Pub. Date: Mar. 11, 2021

(65) Prior Publication Data
US 2022/0334172 A1 Oct. 20, 2022

(51) Int. Cl.
*G01R 31/28* (2006.01)
*H01L 21/66* (2006.01)

(52) U.S. Cl.
CPC .......... *G01R 31/2846* (2013.01); *H01L 22/12* (2013.01)

(58) Field of Classification Search
CPC ............ G05B 23/0281; G01R 31/2846; G01R 31/2894; H01L 22/12; G06N 3/04
USPC ........................................................ 702/117
See application file for complete search history.

(56) References Cited

U.S. PATENT DOCUMENTS

| 7,065,425 | B1 | 6/2006 | Kay et al. |
| 2019/0155173 | A1 | 5/2019 | Tsiatmas et al. |
| 2020/0011927 | A1 | 1/2020 | Kagami |
| 2020/0064398 | A1 | 2/2020 | Uchida et al. |
| 2020/0081757 | A1* | 3/2020 | Ota .................... G06F 11/1004 |

FOREIGN PATENT DOCUMENTS

| JP | 7-27707 | A | | 1/1995 | |
| JP | 4398441 | B2 | | 1/2010 | |
| JP | 2010087070 | A | * | 4/2010 | ............ H01J 37/222 |

(Continued)

OTHER PUBLICATIONS

Machine Translation of JP2010087070A (Year: 2010).*

(Continued)

*Primary Examiner* — John H Le
(74) *Attorney, Agent, or Firm* — Crowell & Moring LLP

(57) ABSTRACT

An objective of the present invention is to provide a system which can infer the cause of a recipe error and present a correction candidate for the recipe error. A recipe information presentation system or recipe error inference system according to the present invention: causes a learner to learn a correspondence between a recipe and an error originating from the recipe; and acquires from the learner an inference result as to whether the error occurs when a new recipe is used (refer to FIG. 1).

19 Claims, 12 Drawing Sheets

(56) References Cited

FOREIGN PATENT DOCUMENTS

| JP | 5933985 B2 | | 6/2016 | |
|---|---|---|---|---|
| JP | 2020042398 A | * | 3/2020 | ......... G05B 23/0254 |
| KR | 10-2017-0100710 A | | 9/2017 | |
| KR | 10-2019-0082911 A | | 7/2019 | |
| TW | 201905611 A | | 2/2019 | |
| WO | WO 2007/013170 A1 | | 2/2007 | |
| WO | WO 2018/102596 A2 | | 6/2018 | |
| WO | WO 2018/159190 A1 | | 9/2018 | |
| WO | WO 2018/179890 A1 | | 10/2018 | |

OTHER PUBLICATIONS

Machine Translation of JP2020042398A (Year: 2020).*
International Search Report (PCT/ISA/210) issued in PCT Application No. PCT/JP2019/035140 dated Oct. 15, 2019 with English translation (four (4) pages).
Japanese-language Written Opinion (PCT/ISA/237) issued in PCT Application No. PCT/JP2019/035140 dated Oct. 15, 2019 (four (4) pages).
Taiwanese-language Office Action issued in Taiwanese Application No. 109123151 dated Apr. 14, 2021 (three (3) pages).
Korean-language Office Action issued in Korean Application No. 10 2022 7004524 dated Apr. 3, 2024 (6 pages).

* cited by examiner

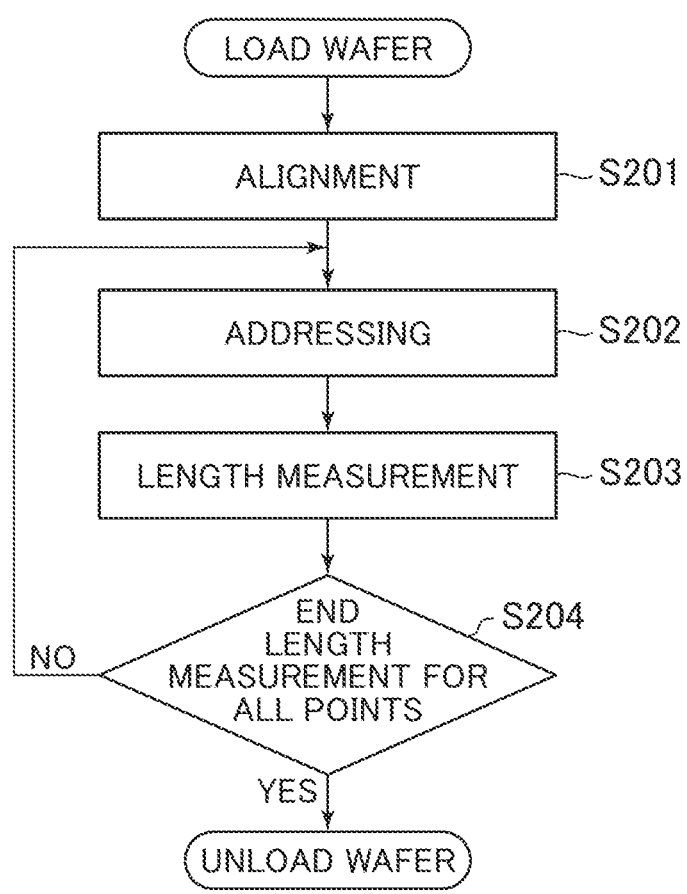

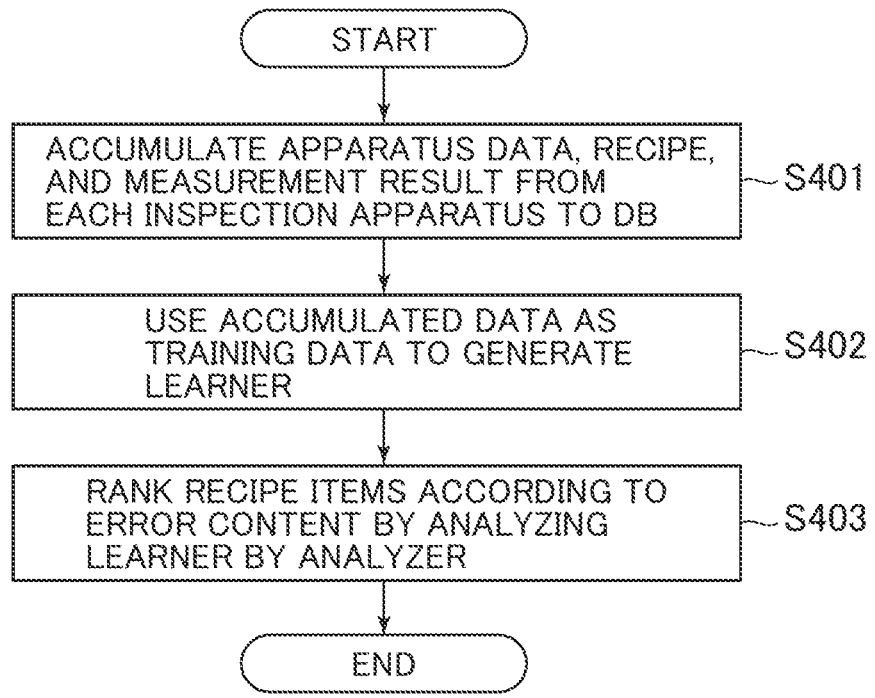

RECIPE INFORMATION PRESENTATION SYSTEM AND RECIPE ERROR INFERENCE SYSTEM

TECHNICAL FIELD

The present invention relates to a system which presents the correction information of a recipe in a semiconductor inspection apparatus, and a system which infers a recipe error.

BACKGROUND ART

A semiconductor measurement apparatus and a semiconductor inspection apparatus execute a measurement operation and an inspection operation according to a set parameter called a recipe. The recipe parameter includes many items, and it is typical that an engineer optimizes each item by a manual operation according to the attribute of a measurement or inspection target, the characteristic of the apparatus, or the like. Therefore, for example, in the case of the change in the characteristic of the apparatus due to change with time or the like, the content of the recipe does not coincide with the actual measurement or inspection target and the apparatus, so that an error may occur in the measurement operation or the inspection operation. Such an error is an error which originates from the content of the recipe, and is thus called a recipe error.

Conventionally, to reduce the recipe error, it is typical that a service engineer enters a semiconductor factory, manually downloads apparatus internal data from the semiconductor measurement apparatus or the semiconductor inspection apparatus, and graphs the apparatus internal data to infer the recipe item which is required to be corrected. This correction operation infers the recipe item which is required to be corrected, on the basis of the experience of the engineer, and thus depends largely on the skill of the engineer.

Patent Literature 1 described below describes a technique for correcting the cause of an error in a recipe. In the literature, the cause of the recipe error is inferred from the recipe having a largest normalized number of errors in an error log (refer to claim 1 in the literature).

Patent Literature 2 described below describes a technique by which a neural network is caused to learn a relationship between a recipe condition and operation time to predict recipe inspection time (refer to claim 1 in the literature).

CITATION LIST

Patent Literature

Patent Literature 1: U.S. Pat. No. 4,398,441
Patent Literature 2: U.S. Pat. No. 5,933,985

SUMMARY OF INVENTION

Technical Problem

With the miniaturization and diversification of semiconductors, the semiconductor measurement apparatus or the semiconductor inspection apparatus has a problem that the complexity of recipe creation and the increased number of recipes lower the availability rate of the apparatus due to the recipe error. Further, the insufficient number of engineers due to the rapid start-up of semiconductor factories typified by China causes the demand for making the recipe correction more efficient to be stronger. However, in the recipe correction, the analysis time and the robustness largely depend according to the skill of the engineer.

In the technique described in Patent Literature 1 described above, the cause of the error is inferred from the error log, but it is thought that how the recipe is to be corrected is not necessarily specifically considered. This is because in the literature, since the information about the normal recipe in which no error has occurred is not used, the recipe cannot be compared between in the error occurrence situation and in the normal situation.

In the technique described in Patent Literature 2 described above, the neural network is caused to learn the relationship between the recipe and the operation time, so that the recipe when the operation time is abnormal may be able to be identified. However, since whether the inferred operation time is an error is not presented, it is thought that it is difficult to infer the cause of the recipe error by the technique in the literature.

The present invention has been made in view of the problems as described above, and an object of the present invention is to provide a system which can infer the cause of a recipe error and present a correction candidate for the recipe error.

Solution to Problem

A recipe information presentation system or recipe error inference system according to the present invention causes a learner to learn a correspondence between a recipe and an error originating from the recipe, and acquires from the learner an inference result as to whether the error occurs when a new recipe is used.

Advantageous Effects of Invention

According to the recipe information presentation system or recipe error inference system according to the present invention, the cause of a recipe error can be inferred, and a correction candidate for the recipe error can be presented.

BRIEF DESCRIPTION OF DRAWINGS

FIG. 2 is a flowchart explaining a process by which a semiconductor inspection apparatus 11 inspects a semiconductor wafer;

FIG. 4 is a flowchart explaining a procedure for the generation of the learner 121 and the analysis of an analyzer;

FIG. 7A is an example of a GUI provided to an operator by the computer system 100;

FIG. 7C is an example of a GUI provided to the operator by the computer system 100;

DESCRIPTION OF EMBODIMENTS

In embodiments described below, a "semiconductor inspection apparatus" refers to an apparatus which measures the size of a pattern formed on a semiconductor wafer, an apparatus which inspects the presence or absence of a defect in the pattern formed on the semiconductor wafer, an apparatus which inspects the presence or absence of a defect in a bare wafer on which the pattern is not formed, or the like, and includes a composite apparatus having the combination of a plurality of these apparatuses.

Also, in the embodiments described below, "inspection" is used in the sense of measurement or inspection, an "inspection operation" is used in the sense of a measurement operation or an inspection operation, and an "inspection target" refers to a wafer to be measured or inspected or a region to be measured or inspected in the wafer.

First Embodiment

Figure 1:
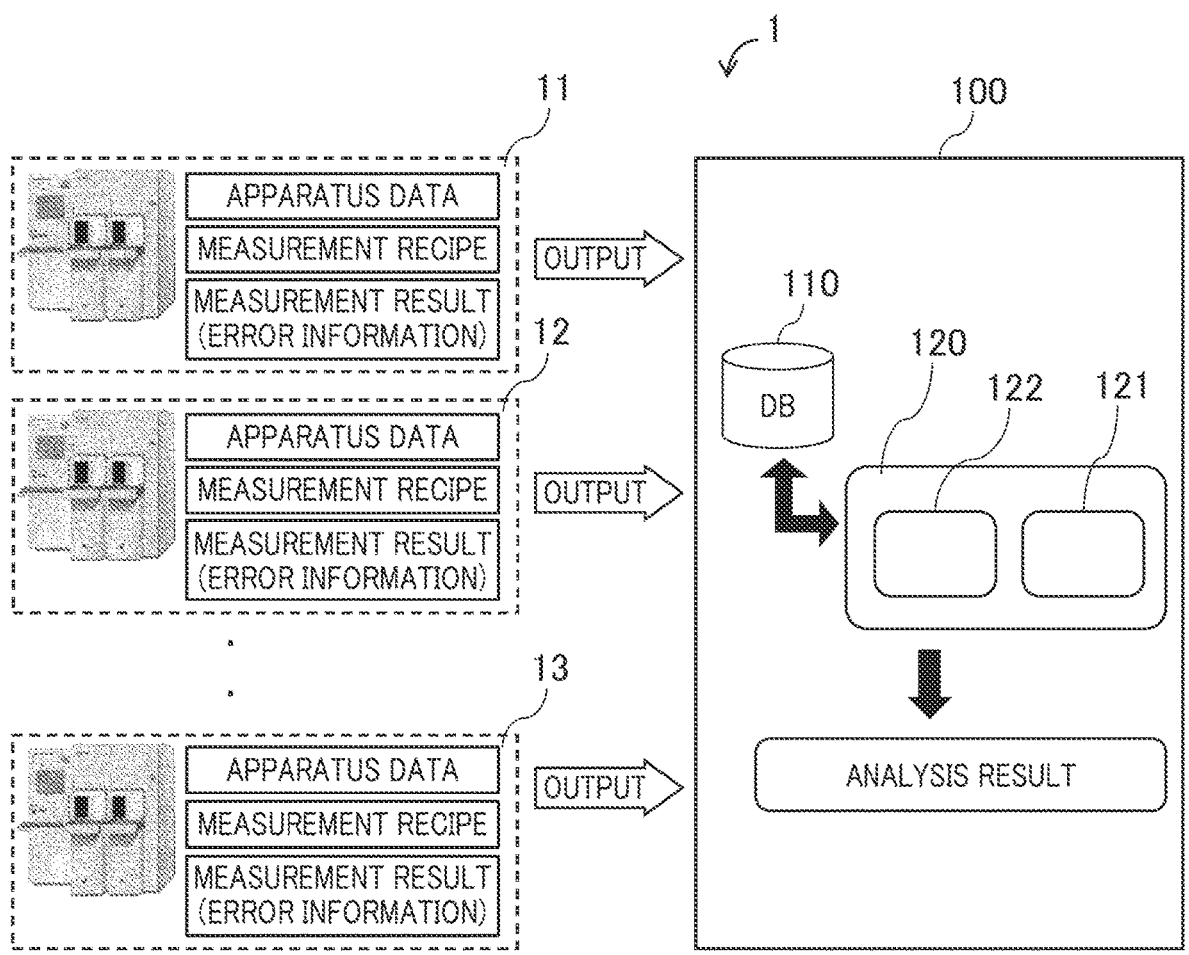
FIG. 1 is a block diagram of a recipe information presentation system or recipe error inference system according to a first embodiment.

FIG. 1 is a block diagram of a recipe information presentation system or recipe error inference system according to a first embodiment of the present invention. The system is a system which infers, among recipes defining the inspection operation executed by the semiconductor inspection apparatus, the recipe which becomes the cause of an error and presents the correction information of the recipe (hereinafter, referred to as the "recipe information presentation system" or the "recipe error inference system"). Here, the system which targets semiconductor inspection apparatuses 11 to 13 is illustrated. The respective inspection apparatuses include the same configuration, so that when the respective inspection apparatuses are not discriminated in the following description, the system will be described with the semiconductor inspection apparatus 11.

The semiconductor inspection apparatus 11 can be configured of, for example, a scanning electron microscope (SEM), an optical inspection apparatus, or the like. Hereinafter, as an example, the SEM which measures the size of the pattern formed on the semiconductor wafer is used. The semiconductor inspection apparatuses 11 to 13 may be the same apparatuses, or may also be apparatuses having different model numbers or the like.

A recipe error inference system 1 includes a computer system 100. The computer system 100 includes a database 110 and a machine learning unit 120. The machine learning unit 120 further includes a learner 121 and an analyzer 122 (and a correction amount calculation unit 123 described later). The database 110 can be configured of a storage device which stores data. The machine learning unit 120 can also be configured of hardware, such as a circuit device, which implements its functions (that is, the functions of the learner 121 and the analyzer 122 and the function of the correction amount calculation unit 123 which will be described later), and can also be configured in such a manner that software which implements its functions is executed by a computation device.

The computer system 100 acquires three data described later from each of the semiconductor inspection apparatuses 11 to 13, and stores the data in the database 110. The learner 121 executes machine learning by using the data as training data. The detail of a learning process will be described later. The operation of the analyzer 122 will be described later.

FIG. 2 is a flowchart explaining a process by which the semiconductor inspection apparatus 11 inspects the semiconductor wafer. The semiconductor inspection apparatus 11 starts this flowchart by loading the semiconductor wafer to be inspected. To execute the inspection, a coordinate system on the semiconductor wafer and a coordinate system in the interior of the semiconductor inspection apparatus 11 are required to be aligned. This step is called alignment (S201). The field of view of the semiconductor inspection apparatus 11 covers only one portion of the surface of the semiconductor wafer, so that the field of view of the semiconductor inspection apparatus 11 is required to be aligned with respect to the region to be inspected. This step is called addressing (S202). The semiconductor inspection apparatus 11 measures the length or the like of the semiconductor pattern formed in the field of view (S203). Until the measurement for all the points to be measured is completed, S202 and S203 are repeated (S204). When the measurement is completed, the semiconductor wafer is unloaded.

Figure 3A:
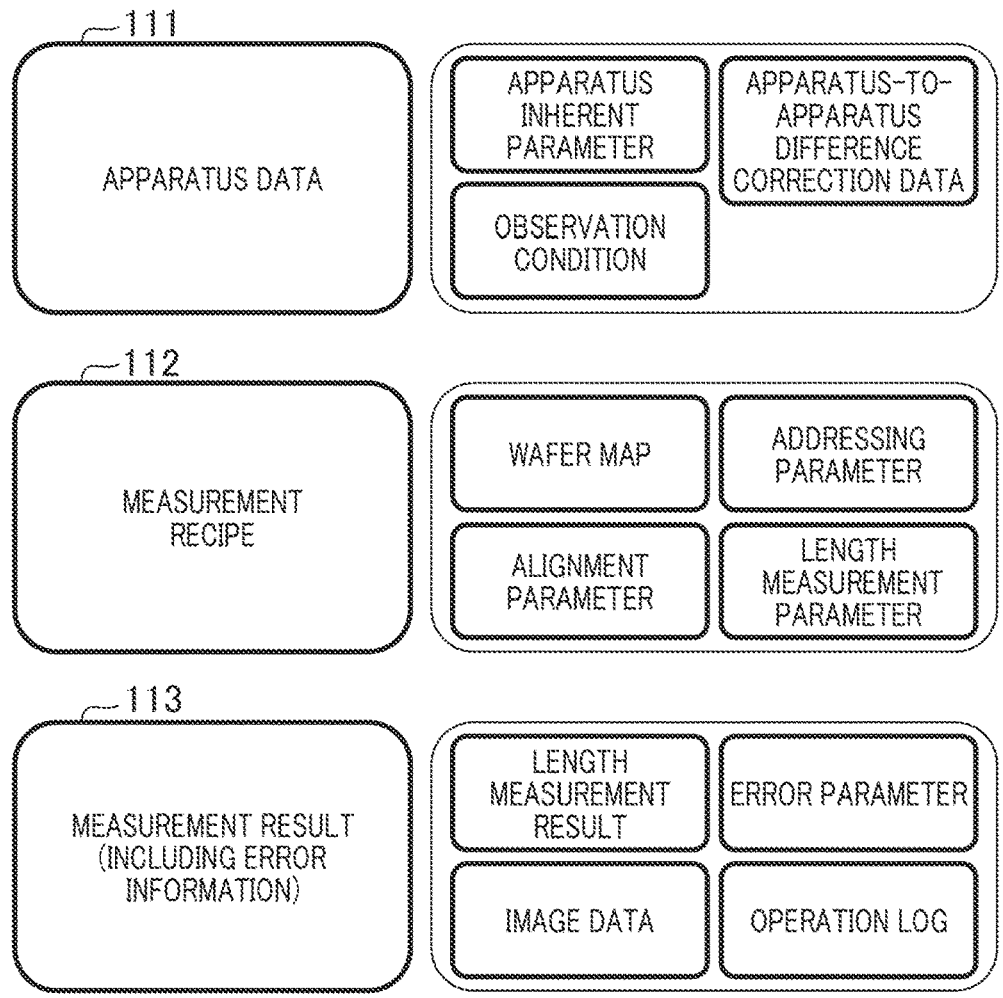
FIG. 3A is a diagram illustrating the content of three data that a computer system 100 acquires from the semiconductor inspection apparatus 11.

FIG. 3A is a diagram illustrating the content of the three data that the computer system 100 acquires from the semiconductor inspection apparatus 11. The computer system 100 acquires, from the semiconductor inspection apparatus 11, apparatus data 111, a measurement recipe (hereinafter, sometimes simply called a "recipe") 112, and a measurement result 113.

The apparatus data 111 includes (a) an apparatus inherent parameter, (b) apparatus-to-apparatus difference correction data, and (c) an observation condition parameter. The apparatus inherent parameter is a correction parameter used for operating the semiconductor inspection apparatus 11 according to the defining specifications. Since the actual operation of the apparatus is sometimes different from the defining specifications, the apparatus inherent parameter is used for causing the actual operation to coincide with the defining specifications. The apparatus-to-apparatus difference correction data is a parameter used for correcting an apparatus-to-apparatus difference between the semiconductor inspection apparatuses 11 to 13. The observation condition parameter is, for example, a parameter which defines the observation condition of the SEM, such as the acceleration voltage of an electron optical system.

The recipe 112 includes, as recipe parameters, (a) a wafer map, (b) an alignment parameter, (c) an addressing parameter, and (d) a length measurement parameter. The wafer map is the coordinate map on the semiconductor wafer (for example, the coordinate of the pattern). The alignment parameter is a parameter used for executing S201, and is, for example, a parameter used for correcting a deviation between the coordinate system on the semiconductor wafer and the coordinate system in the interior of the semiconductor inspection apparatus 11. The addressing parameter is a parameter used for executing S202, and is, for example, information which identifies the characteristic pattern present in the region to be inspected of the pattern formed on the semiconductor wafer (such as a characteristic amount). The length measurement parameter is a parameter which describes a length measurement condition, and is, for example, a parameter which designates in which portion of the pattern the length thereof is measured.

The measurement result 113 includes (a) a length measurement result, (b) image data, (c) an error parameter, and (d) an operation log. The length measurement result describes a result by which the length of the pattern on the semiconductor wafer is measured. The image data is the observation image of the semiconductor wafer. The error parameter is a parameter which describes the error content of an error which has occurred in any one of S201 to S203. The operation log is data which describes the internal state of the semiconductor inspection apparatus 11 at the time of executing each step in FIG. 2. For example, the operation voltage of each component, the coordinate of the field of view for observation, and the like are given.

Figure 3B:
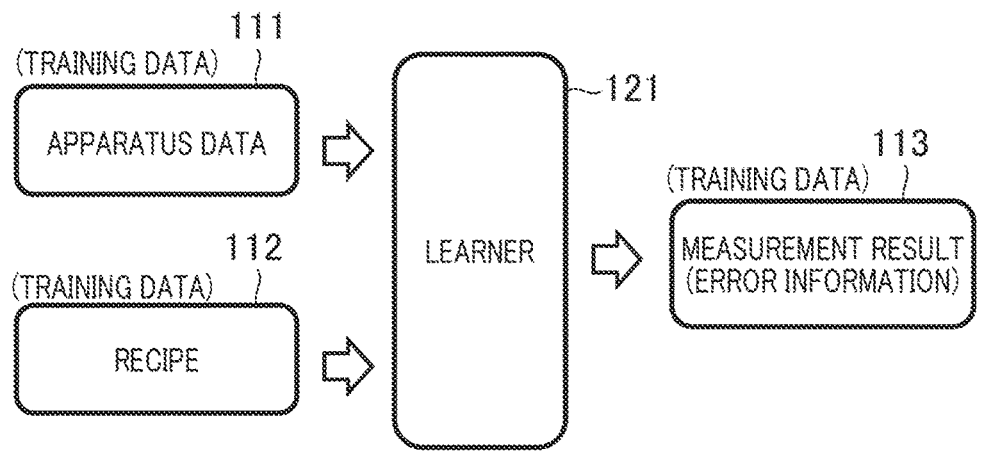
FIG. 3B is a diagram schematically illustrating a correspondence between the input and the output learned by a learner 121.

FIG. 3B is a diagram schematically illustrating a correspondence between the input and the output of the learner 121. The learner 121 executes the machine learning by using, as the training data, the apparatus data 111, the measurement recipe 112, and the measurement result 113, and the learner 121 which receives, as inputs, the apparatus data 111 and the measurement recipe 112 and outputs the measurement result (error information) 113 is generated.

After the learner 121 completes the machine learning, the pair of new apparatus data 502 and a new measurement recipe 501 is inputted to the learner 121, and the learner 121 then uses the apparatus data 502 and the measurement recipe 501 to output, as the measurement result 113, whether an error occurs when the semiconductor inspection apparatus 11 corresponding to the apparatus data 502 executes the inspection for the measurement recipe 501. That is, whether an error occurs is inferred. Further, as described later, the machine learning unit 120 can present a correction amount with respect to the recipe parameter which becomes the cause of the error and a corrected recipe by the learner 121, the analyzer 122, and the correction amount calculation unit 123.

FIG. 4 is a flowchart explaining a procedure for the generation of the learner 121 and the analysis of the analyzer. Hereinafter, each step in FIG. 4 will be described.

FIG. 4: Step S401

The computer system 100 acquires the apparatus data 111, the recipe 112, and the measurement result 113 from each of the semiconductor inspection apparatuses 11 to 13, and stores the data in the database 110. The computer system 100 accumulates these data over a certain period of time (example: several weeks, several months, or the like).

FIG. 4: Step S402

The computer system 100 executes the machine learning by using, as the training data, the data accumulated in the database 110 to generate the learner 121. A correspondence between the input to the learner 121 and the output from the learner 121 in the machine learning in this step is as illustrated in FIG. 3B.

FIG. 4: Step S403

After the machine learning of the learner 121 is completed, the analyzer 122 uses the learning result by the learner 121 or the learning result and the recipe 112 to analyze the influence of each recipe parameter on the prediction result of the learner, thereby ranking the recipe parameters. For example, the ranking can be executed by calculating the SHAP values of the respective recipe parameters. The recipe parameters may be ranked by using the evaluation values other than the SHAP values. Hereinafter, an example using the SHAP values will be described.

FIG. 4: Step S403: Supplement

The SHAP value is a value obtained by converting how much influence each characteristic amount has on a target variable (that is, a contribution degree with respect to the target variable) to a numerical value. Since the recipe 112 includes a plurality of recipe parameters (the ones explained in FIG. 3A), the respective recipe parameters can be determined as the characteristic amounts to calculate the SHAP values of the respective characteristic amounts. By determining that higher degree of contribution means higher SHAP value, the recipe parameters can be ranked. As the target variable, for example, a probability in which an error occurs (or whether an error occurs), or the like can be used. How the ranking example and the ranking result are used will be described later.

Figure 5:
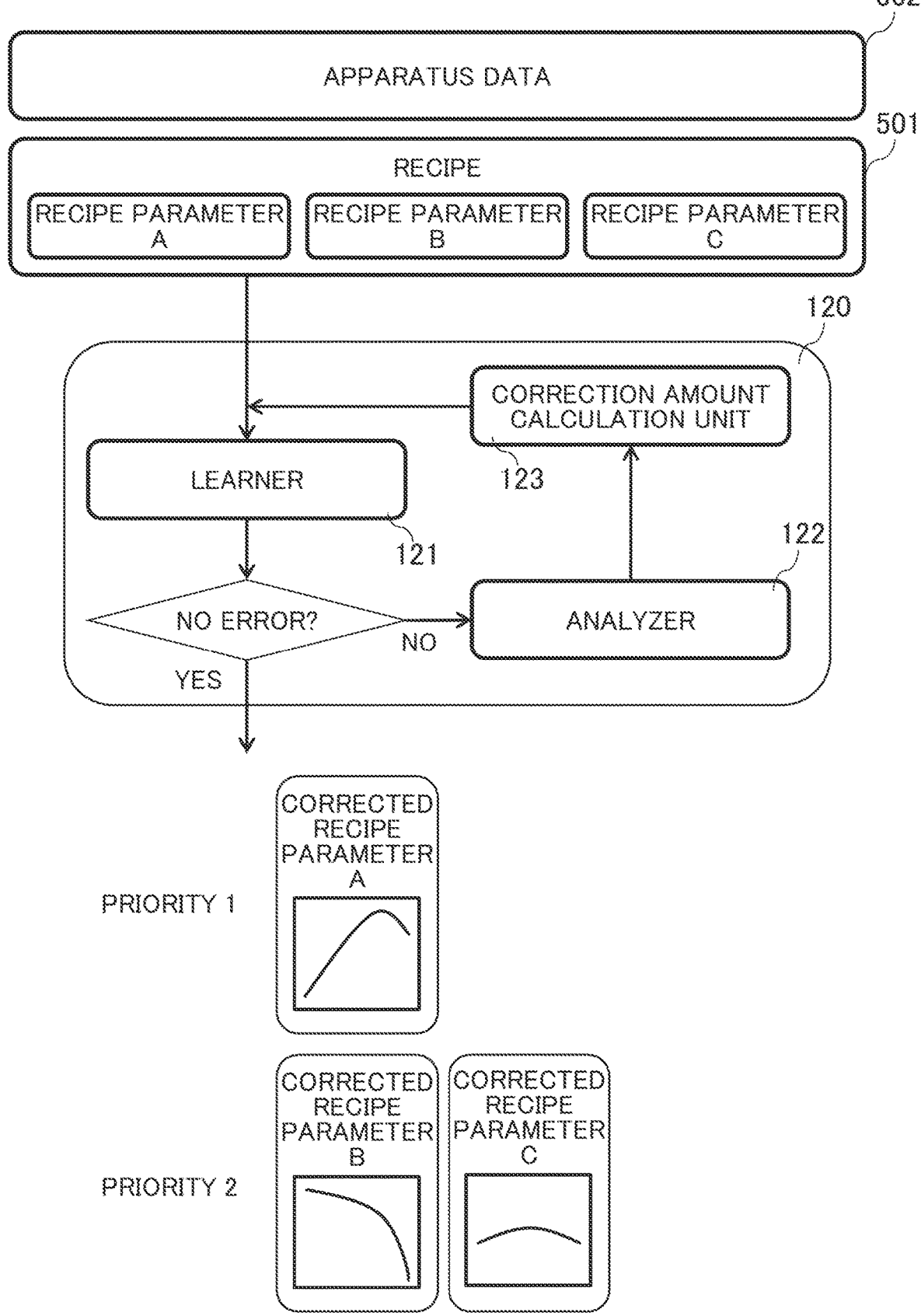
FIG. 5 is a diagram schematically illustrating a procedure for inferring, by the learner 121, whether an error occurs when the semiconductor inspection apparatus 11 uses a new recipe 112.

FIG. 5 is a diagram schematically illustrating a procedure by which whether an error occurs when the new recipe 501 is used by the predetermined semiconductor inspection apparatus is inferred by the learner 121 and the recipe parameters to be corrected and their correction amounts are presented. The learner 121 is assumed to have completed the machine learning described with FIG. 4. For simplifying the description, the new recipe 112 is assumed to have three recipe parameters A to C. Hereinafter, each step in FIG. 5 will be described.

The new recipe 501 and the apparatus data 502 of the predetermined semiconductor inspection apparatus are inputted to the learner 121. The learner 121 infers, according to the learning result, whether an error occurs when the semiconductor inspection apparatus corresponding to the apparatus data 502 uses the new recipe 501. Here, the following description will be continued on the assumption that the learner 121 infers that an error occurs.

The analyzer 122 calculates the contribution degrees (for example, the SHAP values) with respect to the inference results of the respective recipe parameters in the new recipe 501 to rank the respective recipe parameters. The ranking example will be described later.

The machine learning unit 120 includes the correction amount calculation unit 123. The correction amount calculation unit 123 corrects each recipe parameter in the new recipe 501 so that an error does not occur. That is, for each recipe parameter, the correction amount for causing the recipe parameter to have a value in which an error does not occur is calculated. The correction amounts of all the recipe parameters are not necessarily required to be calculated, and for example, the correction amount may be calculated in contribution degree decreasing order. A specific example of the procedure for calculating the correction amount will be described later.

The learner 121 infers anew whether an error occurs by each recipe parameter which reflects the correction amount calculated by the correction amount calculation unit 123. When an error occurs, the above procedure is repeated. When an error does not occur, each recipe parameter which reflects the correction amount is outputted, as a corrected recipe parameter, from the learner 121. At this time, the ranking result by the analyzer 122 may be outputted together. FIG. 5 illustrates an example in which the recipe parameter A has the highest rank.

An operator may reflect the corrected recipe parameter with respect to the new recipe 501 by a manual operation, or the machine learning unit 120 may automatically reflect the corrected recipe parameter with respect to the new recipe 501. Also, as described later, an interface for presenting the correction result to the operator may be provided on the computer system 100. The machine learning unit 120 (or the correction amount calculation unit 123) has a role as a "recipe correction proposition unit" which proposes a correction recipe.

Figure 6A:
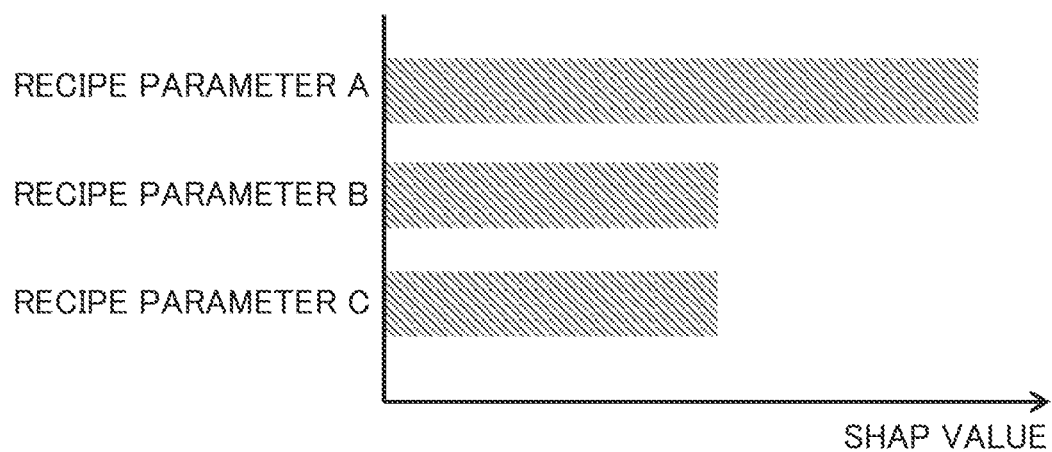
FIG. 6A is a schematic diagram illustrating a result by which an analyzer 122 ranks recipe parameters.

FIG. 6A is a schematic diagram illustrating a result by which the analyzer 122 ranks the recipe parameters. The analyzer 122 can calculate, by the SHAP value, the contribution degree of each recipe parameter with respect to the inference result by the learner 121. The contribution degree can be determined to be high when SHAP value is high in the descending order. Here, an example in which the recipe parameter A has the highest priority rank and the recipe parameters B and C have the same rank is illustrated.

Figure 6B:
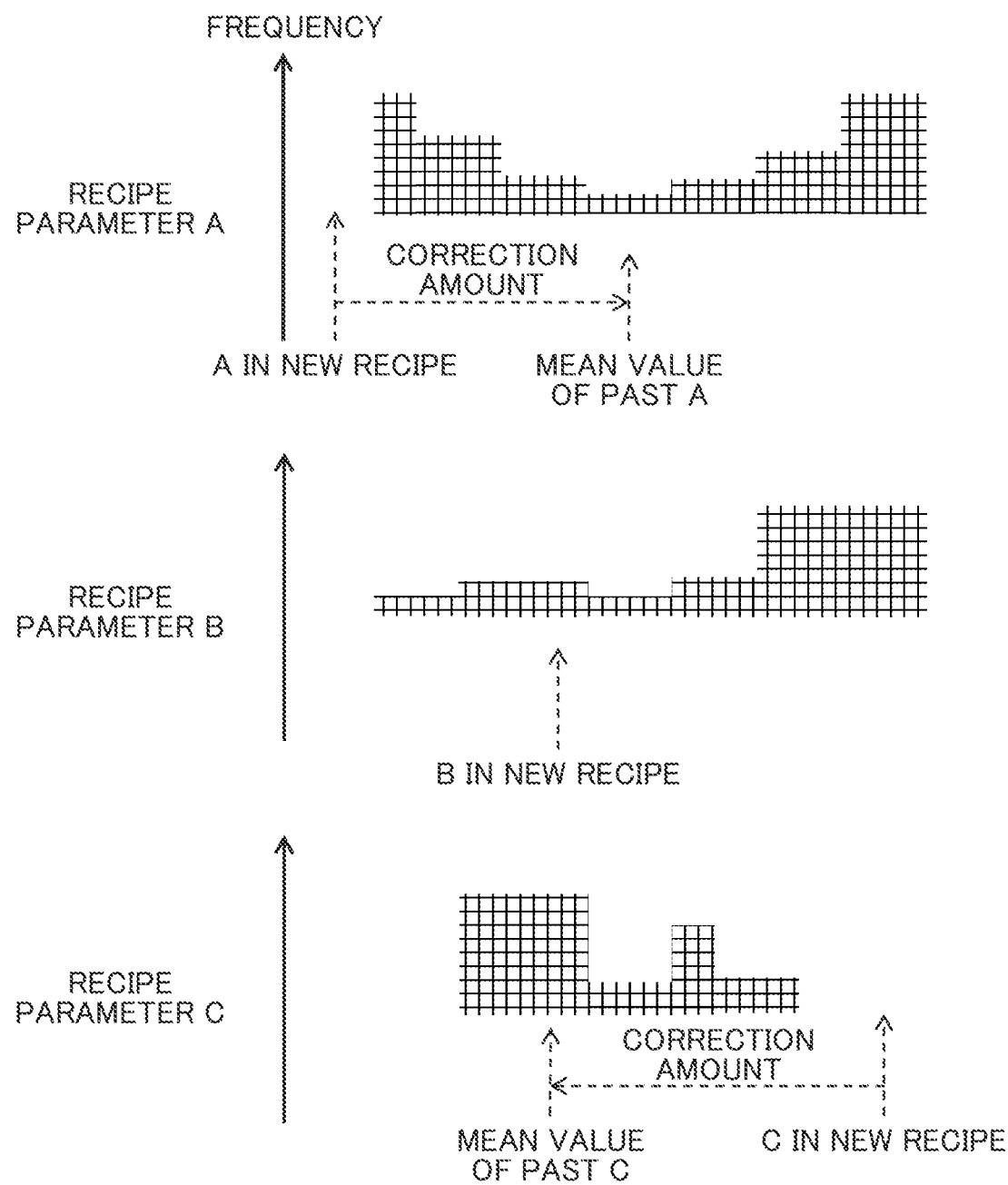
FIG. 6B is a diagram schematically illustrating a procedure by which a correction amount calculation unit 123 calculates the correction amount of the recipe parameter.

FIG. 6B is a diagram schematically illustrating a procedure by which the correction amount calculation unit 123 calculates the correction amount of the recipe parameter. The analyzer 122 calculates the statistical value of a normal recipe parameter in which an error has not occurred in the past. For example, a distribution which represents a relationship between the value of the normal recipe parameter and the frequency can be calculated as the statistical value. In addition, the upper or lower limit value, the mean value, the median value, or the like of the past normal recipe parameter can also be used as the statistical value. FIG. 6B illustrates an example of a frequency distribution from the viewpoint of visual explicitness.

The correction amount calculation unit 123 acquires the recipe parameter A in the new recipe 501. The example of FIG. 6B illustrates an example in which the new recipe parameter A has a value which is slightly off from the frequency distribution of the past normal recipe parameter A. The correction amount calculation unit 123 can calculate the correction amount so that a difference between the new recipe parameter A and the past statistical value becomes smaller. For example, a difference between the new recipe parameter A and the mean value of the past normal recipe parameter A can be the correction amount. When a different statistical amount is adopted, a difference between the new recipe parameter A and the statistical amount can be the correction amount. In addition, by an appropriate method, a difference between the new recipe parameter A and the past statistical amount may be made smaller. Also, the recipe parameter correction may be performed with respect to a plurality of parameters at the same time to perform the error occurrence determination, or may correct the parameters one by one to sequentially perform the error occurrence determination.

Likewise, the correction amount calculation unit 123 calculates the correction amounts of the recipe parameters B and C. When the new recipe parameter is not largely off from the past statistical value, the new recipe parameter is not necessarily required to be corrected. In the example of FIG. 6B, since the new recipe parameter B is within the past frequency distribution, the new recipe parameter B is not necessarily required to be corrected. Alternatively, the new recipe parameter B may be corrected so that a difference between the new recipe parameter B and the statistical value becomes smaller.

Figure 7A:
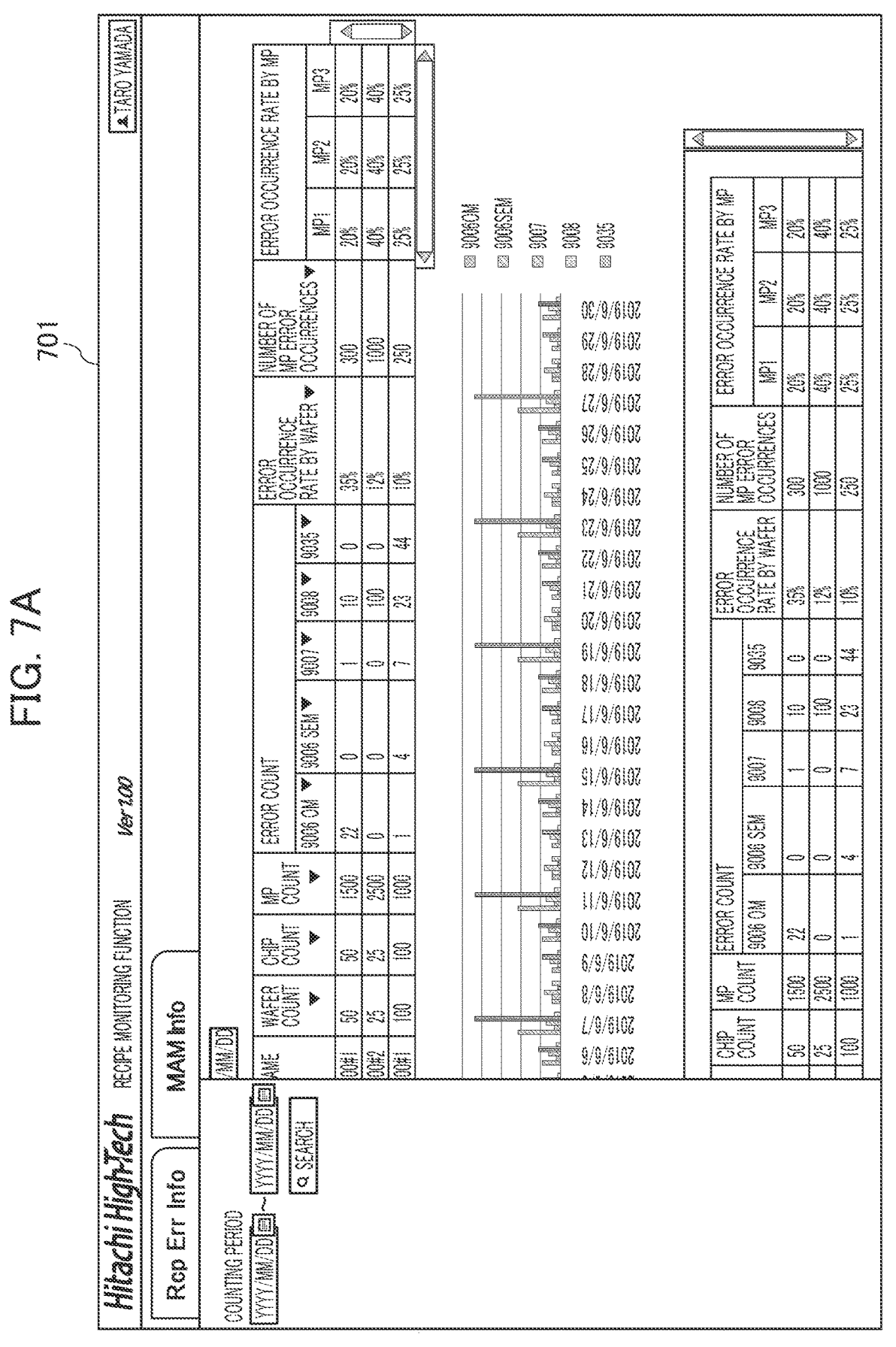

FIG. 7A is an example of a GUI (Graphical User Interface) provided to the operator by the computer system 100. Here, an example of an error display screen 701 is illustrated. The error display screen 701 is a screen which displays the content of an error which occurs in the semiconductor inspection apparatus 11. For example, the content of the measurement result 113 can be displayed on the screen.

Figure 7B:
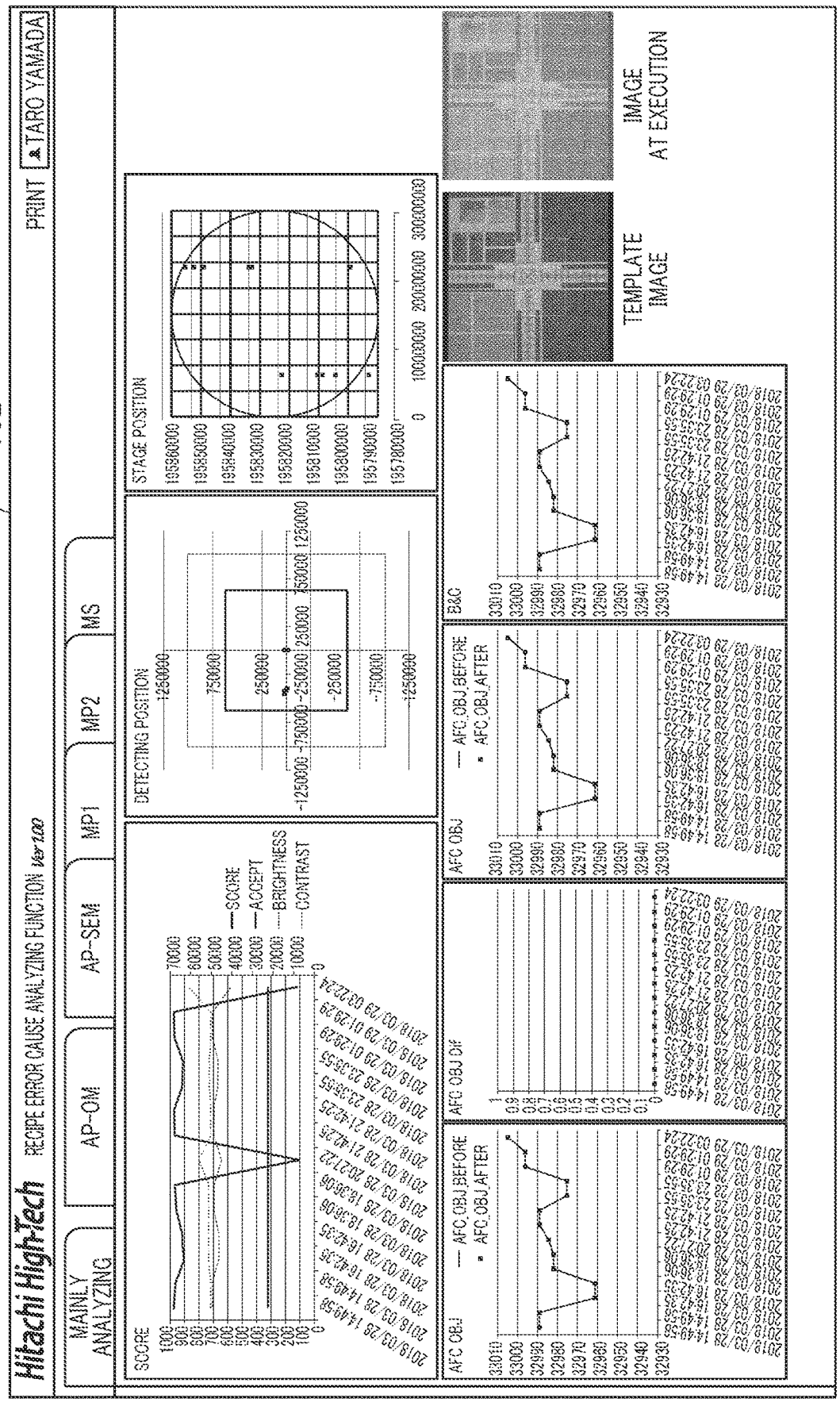
FIG. 7B is an example of a GUI provided to the operator by the computer system 100.

FIG. 7B is an example of a GUI provided to the operator by the computer system 100. Here, an example of a recipe display screen 702 is illustrated. The recipe display screen 702 is a screen which displays the content of the recipe 112. In addition, the content of the apparatus data 111 may be displayed together.

Figure 7C:
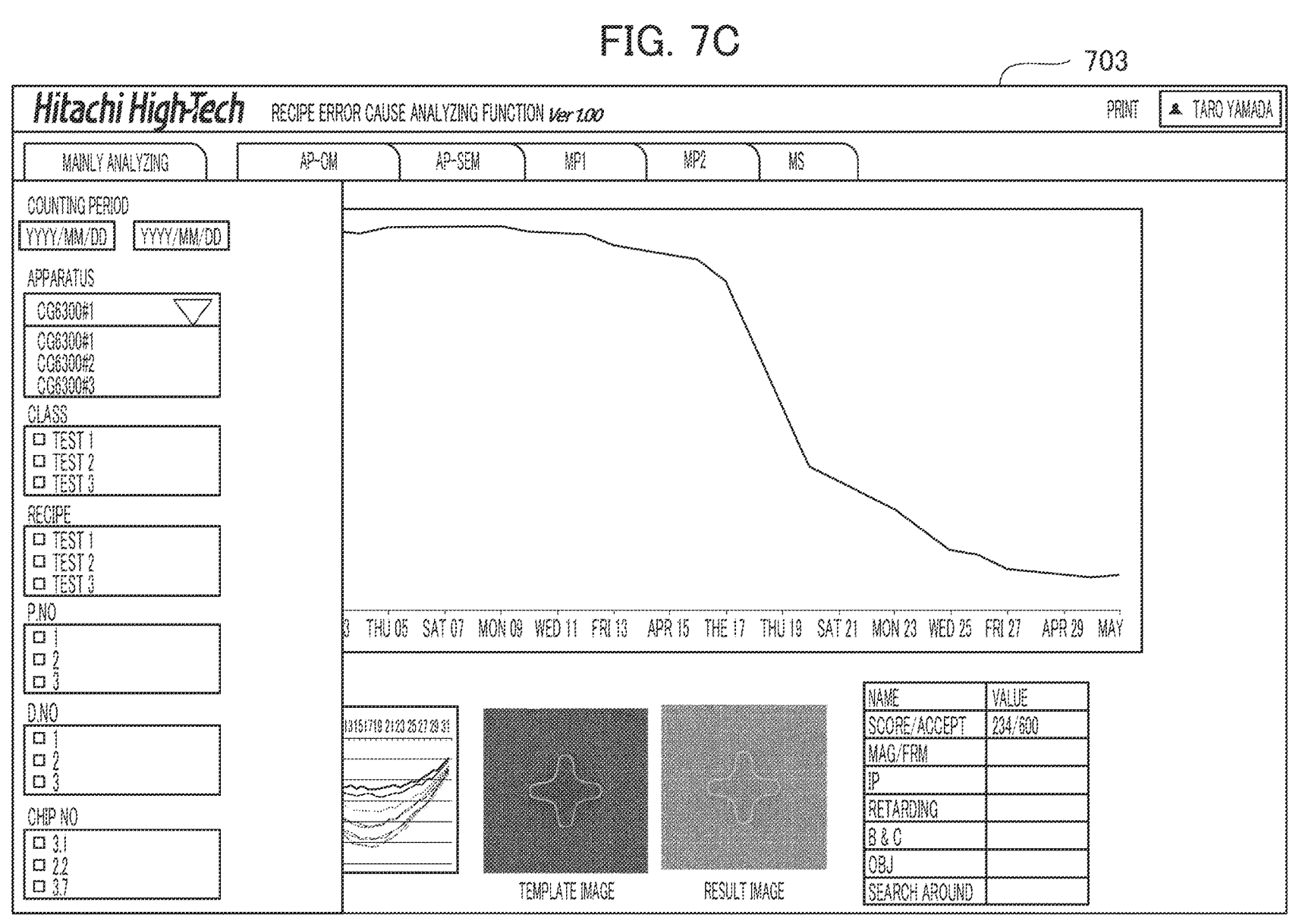

FIG. 7C is an example of a GUI provided to the operator by the computer system 100. Here, an example of a correction recipe display screen 703 is illustrated. The correction recipe display screen 703 is a screen for visually confirming whether an error is reduced by the new recipe 501 corrected according to the procedure described with FIG. 5. The corrected recipe parameter may be displayed together. The operator can confirm the effect of the correction recipe via the correction recipe display screen 703 to decide whether the correction result is reflected, or the like.

Therefore, for example, the GUIs illustrated in FIGS. 7A to 7C can present the following information. (a) The content of the error in the semiconductor inspection apparatus is presented together with a chronological error state. (b) The content of the recipe used by the semiconductor inspection apparatus is presented together with the execution result at the time of executing the recipe. (c) The correction recipe is presented, and the effect of the correction recipe is presented. (d) The recipe or the information related to the recipe is presented.

First Embodiment: Summary

In the recipe error inference system according to the first embodiment, the learner 121 learns a correspondence between the apparatus data 111, the recipe 112, and the measurement result 113, and infers whether an error occurs when the semiconductor inspection apparatus 11 uses the new recipe 501. Thus, the operator can determine whether the new recipe 501 is adopted without depending on individual determination.

In the recipe error inference system according to the first embodiment, the correction amount calculation unit 123 calculates the correction amount of the new recipe parameter according to a difference between the recipe parameter in the past normal recipe and the recipe parameter in the new recipe. Thus, the operator can identify the recipe parameter which becomes the cause of an error without depending on individual determination. Further, since the correction and re-inspection of the recipe parameter are not required to be repeated, the recipe correction operation can be made more efficient.

In the recipe error inference system according to the first embodiment, the analyzer 122 ranks the recipe parameters in the new recipe according to the contribution degrees with respect to the inference results. Thus, since the correction amounts of the recipe parameters can be reflected sequentially in priority rank lowering order, the recipe correction operation can be made more efficient.

In the recipe error inference system according to the first embodiment, when the correction amount of the new recipe parameter is calculated, the recipe parameter which becomes a correction candidate is identified, so that the recipe parameter which becomes the cause of an error can also be inferred. Therefore, the cause of the error can be identified immediately.

Second Embodiment

There are three types of the causes of errors which occur in the semiconductor inspection apparatus: (a) an apparatus originating error which originates from the state of the semiconductor inspection apparatus, (b) a wafer (or process) originating error which originates from the state of the semiconductor wafer, and (c) a recipe originating error which originates from the value of the recipe parameter. Since the apparatus is required to be restored to correct the apparatus originating error, the recipe 112 is not corrected. The wafer originating error may be able to be solved by the recipe correction. Accordingly, in the first embodiment, a correspondence between the apparatus data 111, the recipe 112, and the measurement result 113 is learned to identify an error which can be corrected by the recipe parameter.

On the other hand, it is thought that for the error correction, it is useful to infer from which of the above (a) to (c) an error originates. Accordingly, in a second embodiment of the present invention, a method for inferring the type of an error cause will be described. The configuration of the recipe error inference system is the same as the first embodiment.

Example 1 in which the Type of an Error Cause is Inferred

In the case where the respective semiconductor inspection apparatuses 11 to 13 use the same recipe 112, when an error occurs only in the particular semiconductor inspection apparatus of any one of the semiconductor inspection apparatuses, the computer system 100 can infer that the error originates from the state of the particular semiconductor inspection apparatus. In the case where the respective semiconductor inspection apparatuses use the recipes 112 which are not necessarily strictly the same, but have similar content (for example, a distance between characteristic amount vectors is short), when an error occurs only in the particular semiconductor inspection apparatus, it can be inferred that the error originates from the particular semiconductor inspection apparatus. This inference may be executed by: (a) the computation device included in the computer system 100 according to the above inference rule (This is ditto for Example 2 and Example 3 described below), and (b) the learner 121 in such a manner that the learner 121 is caused to learn the error parameter which occurs only in the particular semiconductor inspection apparatus by using the same recipe 112. In the latter case, the learner 121 infers whether the error is the apparatus originating error, according to a difference between the apparatus data 111 of the respective semiconductor inspection apparatuses.

Example 2 in which the Type of an Error Cause is Inferred

The computer system 100 chronologically acquires the measurement result 113 from the semiconductor inspection apparatus using the particular recipe 112, and when an error occurs therein only in a certain particular period, can infer that the error originates from the state of the semiconductor wafer. Like the above, this is ditto for the case where errors occur only in certain particular periods in the chronological histories of the recipes 112 which are not necessarily strictly the same, but have similar content. For example, this inference can be executed in such a manner that the learner 121 learns the occurrence period of an error which occurs by using the same recipe 112.

Example 3 in which the Type of an Error Cause is Inferred

In the case where the respective semiconductor inspection apparatuses 11 to 13 use the same recipe 112, when errors occur from all the semiconductor inspection apparatuses, the computer system 100 can infer that the errors originate from the recipe 112. Like the above, this is ditto for the case where errors occur from all the semiconductor inspection apparatuses when the recipes 112 which are not necessarily strictly the same, but have similar content. Further, this is ditto for the case where errors occur in the semiconductor inspection apparatuses in which the number of the semiconductor inspection apparatuses is a threshold value or more (for example, errors occur in more than half of the semiconductor inspection apparatuses) even when errors do not necessarily occur in all the semiconductor inspection apparatuses. For example, this inference can be executed in such a manner that the learner 121 learns whether an error occurs in each of a plurality of semiconductor inspection apparatuses using the same recipe 112.

Third Embodiment

A learning model acquired after the learning by the learner 121 corresponds to the training data used for creating the learning model, so that when the content of the training data is changed, the content of the learning model may also be changed. For example, when the semiconductor inspection apparatus is operated for a relatively long period, the apparatus state and the semiconductor wafer state are largely changed from the time of start of operation, so that the learning model may become obsolete. Accordingly, in a third embodiment of the present invention, an operation example in which after the completion of the learning by the learner 121, new training data is used to execute re-learning will be described. The configuration of the recipe error inference system is the same as the first embodiment.

Figure 8:
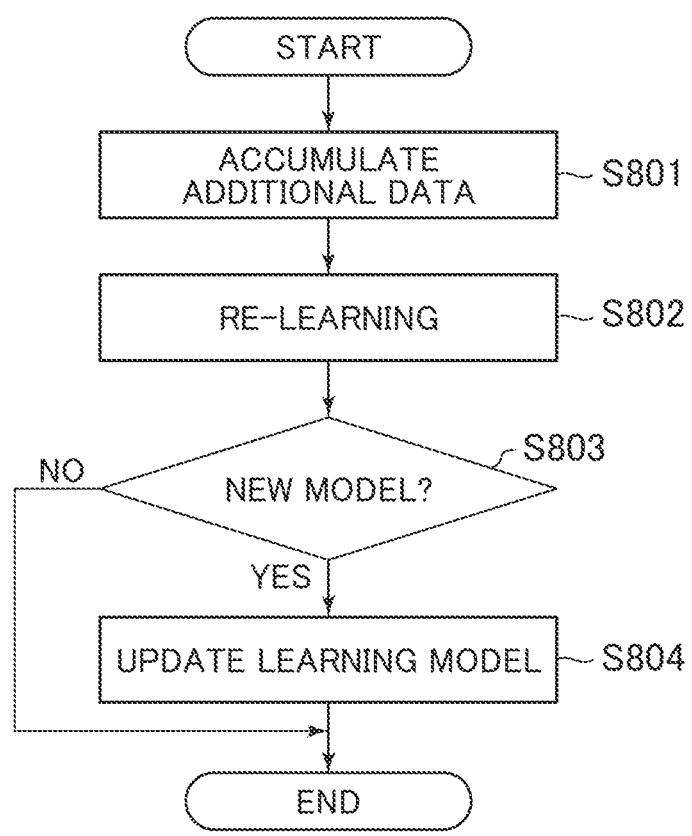
FIG. 8 is an operation flow explaining a procedure by which a machine learning unit 120 executes re-learning.

FIG. 8 is an operation flow explaining a procedure by which the machine learning unit 120 executes the re-learning. This flowchart may be executed each time new training data (additional data) is acquired, or this flowchart may be executed when a certain amount of additional data is accumulated in the database 110. In this flowchart, the machine learning unit 120 has a role as a "re-learning execution unit".

The computer system 100 accumulates additional data into the database (S801). The machine learning unit 120 causes the learner 121 to re-learn the additional data to generate a learning model (S802). The machine learning unit 120 determines whether the newly generated learning model is to be handled as a model different from the existing learning model, according to whether a difference between the newly generated learning model and the existing learning model is a threshold value or more (S803). For example, by comparing a difference between the distances in the characteristic amount space of the parameter described by the learning model or the like and the threshold value, whether the newly generated learning model is the different model can be determined. When the newly generated learning model is the different model, the machine learning unit 120 replaces the existing learning model with the learning model generated in S802 (S804). When the newly generated learning model is not required to be handled as the different model, this flowchart is ended.

Fourth Embodiment

Figure 9:
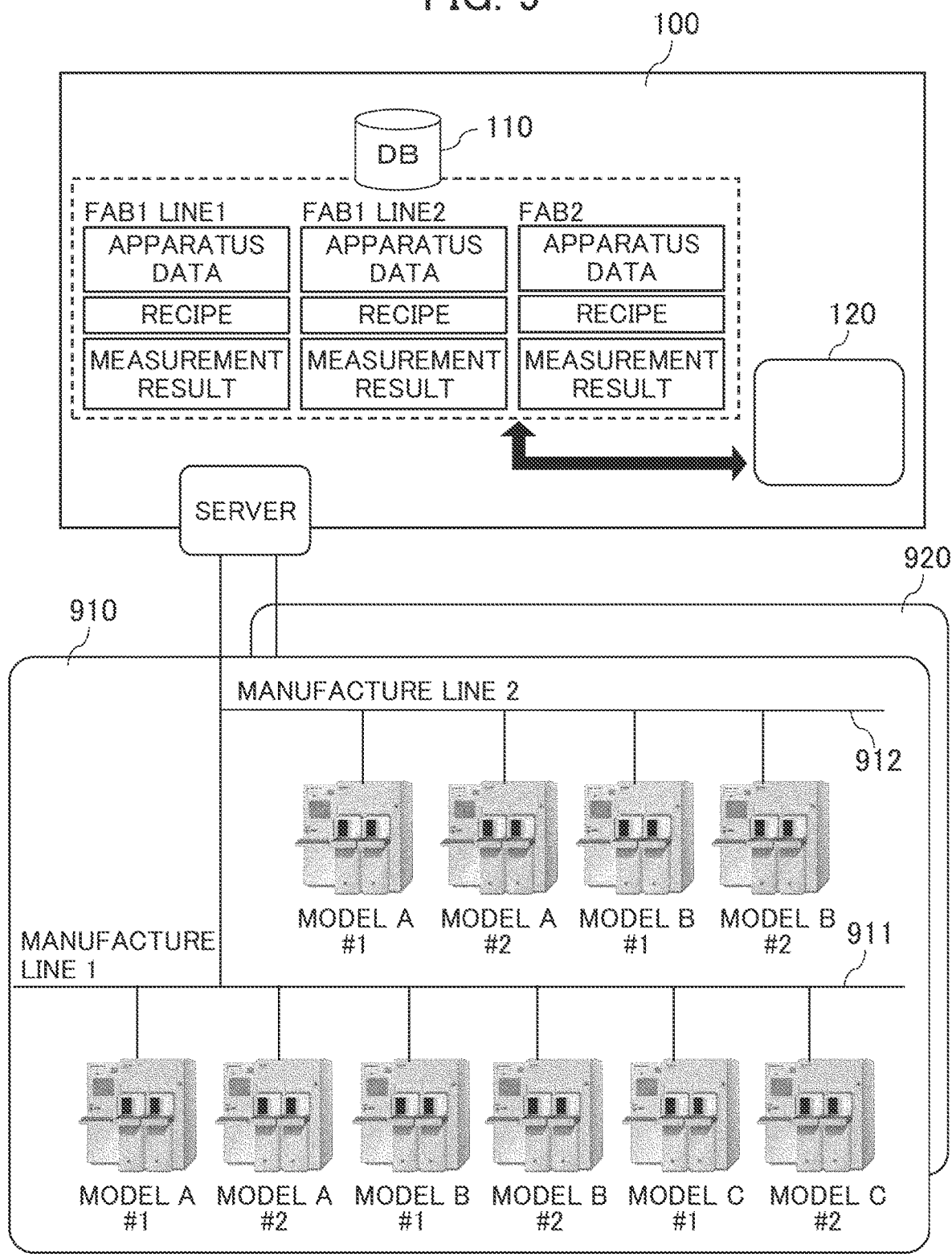
FIG. 9 is a block diagram of a recipe information presentation system or recipe error inference system according to a fourth embodiment.

FIG. 9 is a block diagram of the recipe error inference system according to a fourth embodiment of the present invention. In the fourth embodiment, the recipe error inference system infers an error cause in the semiconductor inspection apparatus at each of a plurality of manufacture bases (Fabric or Fab). Here, a base 910 (Fab1) and a base 920 (Fab2) are illustrated. Each base and the computer system 100 are connected by a network. The configuration of the computer system 100 is the same as the first to third embodiments.

The base 910 has two manufacture lines 911 and 912. The respective manufacture lines are respectively connected with the semiconductor inspection apparatuses having different model numbers (models A, B, and C). The base 920 can also include the same configuration. The computer system 100 is connected with each semiconductor inspection apparatus in each manufacture line in each base, and acquires each of the apparatus data 111, the recipe 112, and the measurement result 113. The process thereafter is the same as the first to third embodiments.

The computer system 100 may generate a learning model different in each base or each manufacture line, or a single learning model in which any ones of these or all of these are integrated. In the former case, a learning model according to the characteristic of each base or each manufacture line can be generated. In the latter case, for example, when the inspection apparatuses in which the respective bases or the respective manufacture lines are similar are used, the inference accuracy can be increased by increasing the training data amount.

About Modification Examples of the Present Invention

The present invention is not limited to the above embodiments, and includes various modification examples. For example, the above embodiments have been described in detail for simply describing the present invention, and are not necessarily required to include all the described configurations. Also, part of the configuration of one of the embodiments can be replaced with the configurations of other embodiments, and in addition, the configuration of the one embodiment can also be added with the configurations of other embodiments. In addition, part of the configuration of each of the embodiments can be subjected to addition, deletion, and replacement with respect to other configurations.

In the above embodiments, the example in which the learner is caused to learn a correspondence between (a) the apparatus data, (b) the recipe, and (c) the measurement result is illustrated, but to identify the recipe error, at least a correspondence between the recipe and the error parameter needs only to be learned. Therefore, such a configuration is also the target of the present invention.

In the above embodiments, the example in which the recipe error in the semiconductor inspection apparatus is inferred has been described, but the learner 121 is caused to learn a parameter which defines the operation of the apparatus and whether an error occurs when the parameter is adopted, so that the present invention is applicable to other apparatuses.

LIST OF REFERENCE SIGNS 11 to 13: Semiconductor inspection apparatus
100: Computer system
110: Database
120: Machine learning unit
121: Learner
122: Analyzer
123: Correction amount calculation unit

The invention claimed is:

1. A system which presents a recipe defining an inspection operation executed by a semiconductor inspection apparatus or information related to the recipe, the system comprising:
the semiconductor inspection apparatus; and
a computer system which infers the recipe which becomes a cause of an error which occurs in the semiconductor inspection apparatus,
wherein the computer system includes a learner which learns, by machine learning, a correspondence between the recipe used when the semiconductor inspection apparatus executes the inspection operation and the error which originates from the recipe,
wherein the computer system introduces a new recipe into the learner after the learner completes the machine learning, and acquires, as the output of the learner, an inference result as to whether the error occurs when the semiconductor inspection apparatus uses the new recipe,
wherein when acquiring, from the learner, the inference result indicating that the error occurs by the new recipe, the computer system repeats correction of the new recipe and re-introduction of a corrected new recipe into the learner until the inference result indicating that the error does not occur is acquired, and
wherein the computer system presents that the recipe or the information related to the recipe acquired by the repetition is to be used by the semiconductor inspection apparatus.

2. The system according to claim 1,
wherein the recipe describes one or more recipe parameters which define the inspection operation,
wherein the learner learns a correspondence between the combination of the recipe parameters that the semiconductor inspection apparatus uses when the error occurs and an error parameter which describes the content of the error, and
wherein the computer system introduces the recipe parameter described by the new recipe into the learner to acquire, as the inference result, the error parameter corresponding to the recipe parameter.

3. The system according to claim 2,
wherein the recipe describes, as the parameter defining the inspection operation, at least any one of a coordinate map on a semiconductor wafer inspected by the semiconductor inspection apparatus, an alignment parameter used for aligning the coordinate system of the semiconductor wafer and the coordinate system of the semiconductor inspection apparatus, an addressing parameter used for aligning a position inspected by the semiconductor inspection apparatus with an inspection position on the semiconductor wafer, and a length measurement parameter used for designating a portion whose length is to be measured, of a pattern formed on the semiconductor wafer at the inspection position.

4. The system according to claim 2,
wherein the error parameter describes, together with the content of the error, at least any one of a length measurement result describing a result by which the length of the pattern formed on the semiconductor wafer inspected by the semiconductor inspection apparatus is identified, an observation image acquired by observing the semiconductor wafer by the semiconductor inspection apparatus, and the operation log of the semiconductor inspection apparatus.

5. The system according to claim 1,
wherein the recipe describes one or more recipe parameters which define the inspection operation,
wherein the computer system includes a recipe correction proposition unit which executes the repetition to present a correction proposal with respect to the recipe in which the error occurs, and
wherein the recipe correction proposition unit presents, as the correction proposal, the recipe parameter to be used by the semiconductor inspection apparatus as a correction candidate parameter, and presents the correction amount of the correction candidate parameter.

6. The system according to claim 5,
wherein the learner further includes an analyzer which calculates the contribution degree of the recipe parameter with respect to the error, and
wherein the recipe correction proposition unit identifies the correction candidate parameter from among the recipe parameters according to the contribution degree.

7. The system according to claim 5,
wherein the computer system further includes a correction amount calculation unit which calculates the correction amount,
wherein the correction amount calculation unit acquires the value distribution or statistical value of a normal recipe parameter in a past normal recipe in which the error has not occurred, and
wherein the correction amount calculation unit calculates the correction amount according to a difference between the correction candidate parameter and the value distribution or statistical value of the normal recipe parameter corresponding to the correction candidate parameter in the normal recipe.

8. The system according to claim 1,
wherein the computer system acquires apparatus data which describes a state parameter representing the state of the semiconductor inspection apparatus,
wherein the learner learns, by the machine learning, a correspondence between the recipe, the state parameter, and the error parameter which describes the content of the error, and
wherein the computer system introduces the state parameter into the learner together with the new recipe after the learner completes the machine learning, and acquires, as the output of the learner, the inference result as to whether the error occurs when the semiconductor inspection apparatus uses the new recipe and the semiconductor inspection apparatus is in a state represented by the state parameter.

9. The system according to claim 8,
wherein the semiconductor inspection apparatus includes a first inspection apparatus and a second inspection apparatus,
wherein the computer system acquires, as the state parameter, a first apparatus parameter representing the state of the first inspection apparatus, and a second apparatus parameter representing the state of the second inspection apparatus,
wherein the learner learns, by the machine learning, a correspondence between the recipe, the first apparatus parameter, the second apparatus parameter, and the error, and
wherein the learner infers whether the error originates from at least any one of the first apparatus parameter and the second apparatus parameter, according to a difference between the first apparatus parameter and the second apparatus parameter.

10. The system according to claim 8,
wherein the apparatus data describes, as the state parameter, at least any one of a apparatus inherent parameter describing an operation correction parameter for operating the semiconductor inspection apparatus according to defining specifications, an apparatus-to-apparatus difference correction parameter describing an operation correction parameter for correcting an apparatus-to-apparatus difference between the semiconductor inspection apparatuses, and an observation condition parameter describing an observation condition by the semiconductor inspection apparatus.

11. The system according to claim 1,
wherein the learner identifies each of a point in time when the error occurs and a point in time when the error does not occur by using the same recipe or a similar recipe group in the chronological history of the correspondence learned by the machine learning, and infers whether the error originates from the state of an inspection target of the semiconductor inspection apparatus.

12. The system according to claim 1,
wherein the semiconductor inspection apparatus includes a first inspection apparatus and a second inspection apparatus, and
wherein the learner infers whether the error originates from the recipe, according to whether the error occurs in each of the first inspection apparatus and the second inspection apparatus by using the same recipe or the similar recipe group.

13. The system according to claim 1,
wherein the computer system further includes a re-learning execution unit which causes the learner to re-execute the machine learning after the machine learning is completed,
wherein the re-learning execution unit acquires a new correspondence between a new recipe and a new error after the machine learning is completed, and inputs the new correspondence to the learner to cause the learner to re-execute the machine learning, and
wherein when a difference between a learning data model describing the result of the machine learning and a re-learning data model describing the result of the re-execution is a determination threshold value or more, the re-learning execution unit replaces the learning data model with the re-learning data model.

14. The system according to claim 1,
wherein the computer system further includes a user interface which presents, together with the content of the error, the parameter representing the state of the semiconductor inspection apparatus when the error occurs in the semiconductor inspection apparatus.

15. The system according to claim 14,
wherein the computer system further presents the recipe or the information related to the recipe to the user interface.

16. The system according to claim 1,
wherein the computer system further includes a user interface which presents, together with the chronological error state of the error, the content of the error in the semiconductor inspection apparatus.

17. The system according to claim 1,
wherein the computer system further includes a user interface which presents, together with an execution result at the time of executing the recipe, the content of the recipe in the semiconductor inspection apparatus.

18. The system according to claim 1,
wherein the computer system further includes a user interface which can present a result by which the recipe is corrected in the semiconductor inspection apparatus, to confirm the effect of the correction recipe.

19. A system which infers, among recipes defining an inspection operation executed by a semiconductor inspection apparatus, a recipe that becomes a cause of an error which occurs in the semiconductor inspection apparatus, the system comprising:
- the semiconductor inspection apparatus; and
- a computer system which infers the recipe which becomes the cause of the error,
- wherein the computer system includes a learner which learns, by machine learning, a correspondence between the recipe used for executing the inspection operation by the semiconductor inspection apparatus and the error which originates from the recipe,
- wherein the computer system introduces a new recipe into the learner after the learner completes the machine learning to acquire, as the output of the learner, an inference result as to whether the error occurs when the semiconductor inspection apparatus uses the new recipe, and infers the recipe that becomes the cause of the error on the basis of the inference result, and
- wherein when acquiring, from the learner, the inference result indicating that the error occurs by the new recipe, the computer system repeats correction of the new recipe and re-introduction of a corrected new recipe into the learner until the inference result indicating that the error does not occur is acquired.

* * * * *